United States Patent [19]
Suzuki

[11] Patent Number: 5,909,642
[45] Date of Patent: Jun. 1, 1999

[54] NONLINEAR DISTORTION DETECTING CIRCUIT AND NONLINEAR DISTORTION COMPENSATING CIRCUIT FOR TRANSMITTER

[75] Inventor: Hiroshi Suzuki, Kawasaki, Japan

[73] Assignee: Fujitsu Limited, Kanagawa, Japan

[21] Appl. No.: 08/799,482

[22] Filed: Feb. 12, 1997

[30] Foreign Application Priority Data

Jul. 5, 1996 [JP] Japan ................................. 8-176036

[51] Int. Cl.$^6$ ....................................................... H04B 1/04
[52] U.S. Cl. .......................... 455/114; 455/115; 455/126; 455/127; 375/297
[58] Field of Search ........................... 455/63, 67.1, 67.3, 455/114, 115, 126, 127; 330/149, 151, 2, 277, 278, 285; 375/296, 297

[56] References Cited

U.S. PATENT DOCUMENTS

| | | | |
|---|---|---|---|
| 4,811,422 | 3/1989 | Kahan | 455/114 |
| 5,204,881 | 4/1993 | Cardini et al. | 455/115 |
| 5,404,378 | 4/1995 | Kimura | 455/63 |
| 5,523,716 | 6/1996 | Grebliunas et al. | 330/149 |
| 5,589,797 | 12/1996 | Gans et al. | 330/149 |
| 5,606,286 | 2/1997 | Bains | 330/149 |
| 5,712,593 | 1/1998 | Buer et al. | 330/285 |
| 5,745,006 | 4/1998 | Budnik et al. | 455/126 |
| 5,748,678 | 5/1998 | Valentine et al. | 375/297 |

*Primary Examiner*—Dwayne D. Bost
*Assistant Examiner*—Quochien Ba Vuong
*Attorney, Agent, or Firm*—Helegott & Karas, P.C.

[57] ABSTRACT

An input unit enters two reference signals having respective different frequencies at a stage preceding a power amplifier. The reference signals are delivered through a predistortion circuit to a power amplifier, and supplied from a predetermined section of the power amplifier. The signals from the power amplifier contain a third-order intermodulation distortion component. Based on the signals from the power amplifier, an extracting unit extracts a frequency component having a frequency which is twice the difference between the frequencies of said two reference signals. A detecting unit detects the extracted frequency component thereby to output a DC voltage. Since the extracted frequency component is correlated to the third-order intermodulation distortion component, the DC voltage represents the magnitude of the third-order inter-modulation distortion component.

8 Claims, 17 Drawing Sheets

NONLINEAR DISTORTION DETECTING CIRCUIT AND NONLINEAR DISTORTION COMPENSATING CIRCUIT FOR TRANSMITTER

BACKGROUND OF THE INVENTION

1. Field of the Invention

The present invention relates to a nonlinear distortion detecting circuit and a nonlinear distortion compensating circuit for a transmitter, and more particularly to a nonlinear distortion detecting circuit and a nonlinear distortion compensating circuit for a transmitter which generates a third-order intermodulation distortion due to its nonlinearity.

2. Description of the Related Art

Multiplex radio communication devices use a predistortion circuit or predistorter for minimizing a nonlinear distortion generated by a transmitter thereby to compensate for such a nonlinear distortion. The predistortion circuit is positioned in a stage prior to a power amplifier (high-output amplifier), for generating in advance a signal in opposite phase with a nonlinear distortion that is generated by the power amplifier. For optimally adjusting the predistortion circuit, it is necessary to monitor third-order intermodulation distortion components. The present invention is concerned with the provision of a circuit for easily monitoring such third-order intermodulation distortion components and also a circuit for automatically optimally adjusting a predistortion circuit.

In order to optimally adjust the predistortion circuit of a transmitter, it has conventionally been practiced to supply two continuous waves of different frequencies to an input terminal of the transmitter and monitor an output signal from an output terminal of the transmitter with a spectrum analyzer which is connected to the output terminal. Rather than the two continuous waves, a modulated wave or a single continuous wave may be supplied to the input terminal of the transmitter.

Generally, the power amplifier (high-output amplifier) of a transmitter is often used in the nonlinearity region of the transmitter for operating the transmitter highly efficiently. A distortion generated by the transmitter due to the nonlinearity thereof is compensated for by a predistortion circuit. For adjusting the predistortion circuit, it is necessary to monitor a nonlinear distortion contained in the output signal from the transmitter. According to a specific process of monitoring such a nonlinear distortion, two continuous waves are supplied to an intermediate-frequency amplifier and a signal produced from an output terminal of the power amplifier is monitored. For example, two continuous waves having respective frequencies of 65 MHz and 70 MHz, for example, are supplied to the intermediate-frequency amplifier, which up-converts them respectively into continuous waves having respective frequencies of 8065 MHz and 8070 MHz.

It is assumed that the frequencies of 8065 MHz and 8070 MHz are represented by $f_1$ and $f_2$, respectively, in FIG. 17 of the accompanying drawings. When the continuous waves having these frequencies $f_1$ and $f_2$ are supplied to a power amplifier, the power amplifier produces an output signal which contains third-order intermodulation distortions (thereinafter referred to as "IM3") having frequencies $(2f_1-f_2)$, $(2f_2-f_1)$. The frequency $(2f_1-f_2)$ is 8060 MHz and the frequency $(2f_2-f_1)$ is 8075 MHz. The IM3 are monitored, and the predistortion circuit is adjusted to minimize the IM3.

According to the conventional adjusting process, it is necessary to use a spectrum analyzer to monitor the IM3 because the frequencies 8060 MHz and 8075 MHz of the IM3 signals are very close to the frequencies 8065 MHz and 8070 MHz of the original continuous waves by a small frequency difference of 5 MHz.

However, the spectrum analyzer for use in a microwave range is expensive and heavy. The heavy spectrum analyzer poses limitations when the transmitter needs to be adjusted on site for panel replacement or maintenance.

One solution would be not to use any spectrum analyzer, to extract and convert the IM3 signal of 8060 MHz, for example, into a DC voltage, and to monitor the DC voltage. According to such a solution, a nonlinear distortion detecting circuit used would need a filter having such a sharp cutoff characteristic curve that would pass the IM3 signal of 8060 MHz and reduce the level of the signal of 8065 MHz by about 60 dB. As a result, the nonlinear distortion detecting circuit would be highly expensive.

SUMMARY OF THE INVENTION

It is therefore an object of the present invention to provide a nonlinear distortion detecting circuit for a transmitter, which makes it possible to adjust a nonlinear distortion compensating circuit without use of an expensive and heavy spectrum analyzer.

Another object of the present invention is to provide a nonlinear distortion compensating circuit which employs such a nonlinear distortion detecting circuit.

According to the present invention, there is provided a nonlinear distortion detecting circuit in a transmitter which generates a third-order intermodulation distortion due to nonlinearity thereof, comprising a power amplifier, input means for entering two reference signals having respective different frequencies at a stage preceding the power amplifier, extracting means for extracting a frequency component having a frequency which is twice the difference between the frequencies of the two reference signals, based on a signal supplied from a predetermined section of the power amplifier, and detecting means for detecting the frequency component extracted by the extracting means.

According to the present invention, there is also provided a nonlinear distortion compensating circuit in a transmitter which generates a third-order intermodulation distortion due to nonlinearity thereof, comprising a power amplifier, input means for entering at least one reference signal at a stage preceding the power amplifier, extracting means for extracting a frequency component related to the third-order intermodulation distortion, based on a signal supplied from a predetermined section of the power amplifier, detecting means for detecting the frequency component extracted by the extracting means thereby to output a DC voltage corresponding to the third-order intermodulation distortion, a predistortion circuit disposed in a stage preceding the power amplifier and comprising a field-effect transistor, for compensating for a distortion generated by the power amplifier, and control means for adjusting a gate bias of the field-effect transistor of the predistortion circuit depending on the DC voltage outputted from the detecting means.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
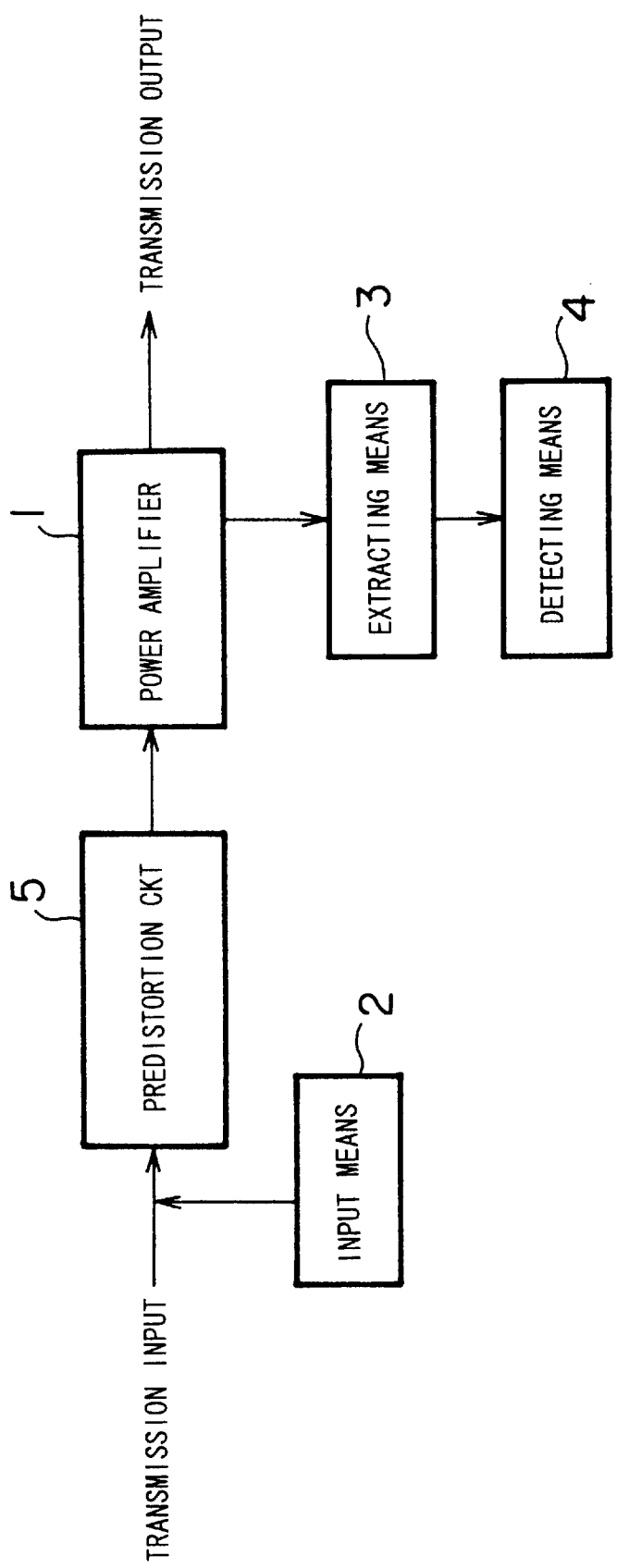
FIG. 1 is a block diagram showing the principles of a nonlinear distortion detecting circuit according to a first embodiment of the present invention.

The principles of a nonlinear distortion detecting circuit according to a first embodiment of the present invention will first be described below with reference to FIG. 1.

The nonlinear distortion detecting circuit according to the first embodiment of the present invention comprises a power amplifier 1, an input means 2 for entering two reference signals having respective different frequencies at a stage preceding the power amplifier 1, an extracting means 3 for extracting a frequency component having a frequency which is twice the difference between the frequencies of the two reference signals, based on signals supplied from a predetermined section of the power amplifier 1, and a detecting means 4 for detecting the frequency component extracted by the extracting means 3.

The nonlinear distortion detecting circuit, which is typically incorporated in a transmitter, further includes a predistortion circuit 5 positioned at a stage immediately preceding the power amplifier 1.

For adjusting the predistortion circuit 5, the input means 2 enters two reference signals having respective different frequencies at a stage preceding the power amplifier 1 and the predistortion circuit 5. The two reference signals are delivered through the predistortion circuit 5 into the power amplifier 1, and supplied from the certain section of the power amplifier 1. The two reference signals thus supplied from the power amplifier 1 contain third-order intermodulation distortion components (IM3). Based on the IM3 signals from the power amplifier 1, the extracting means 3 extracts a frequency component having a frequency which is twice the difference between the frequencies of the two reference signals.

Figure 17:
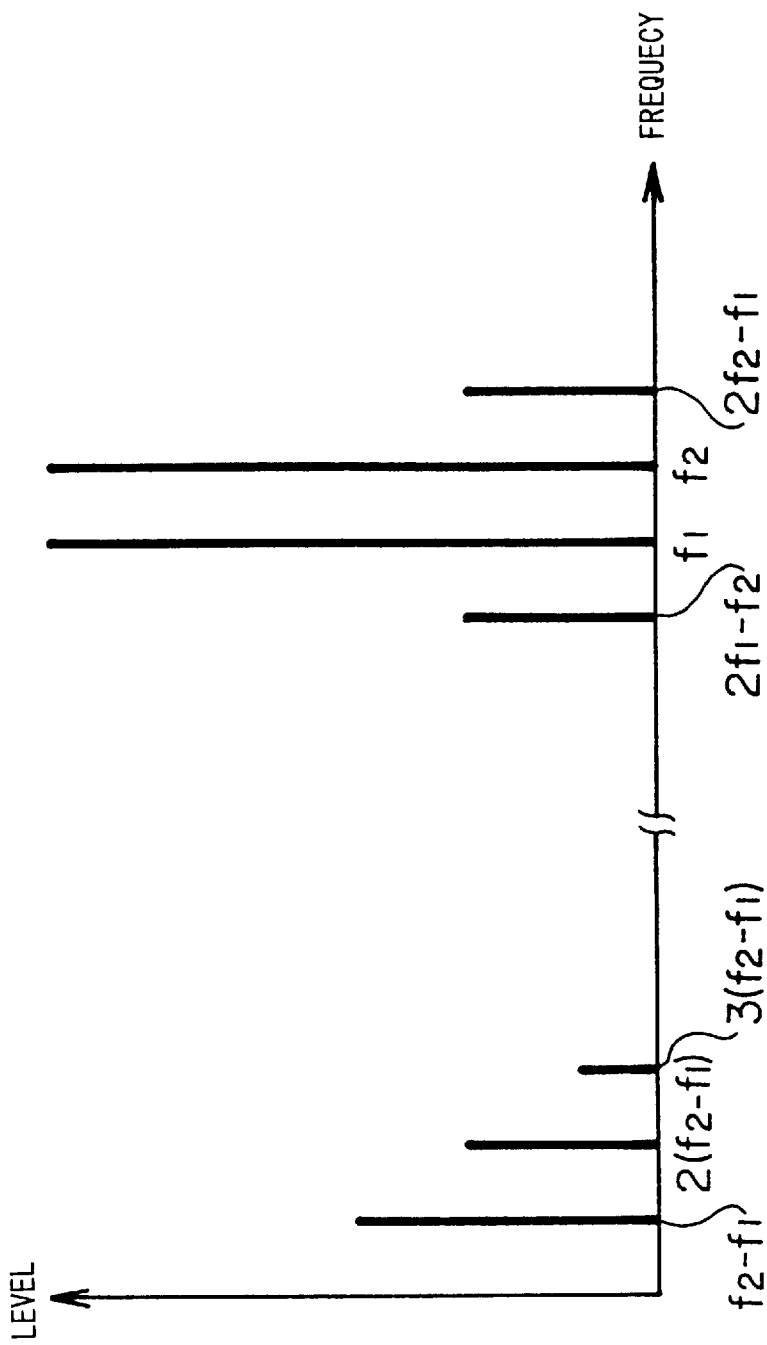
FIG. 17 is a diagram showing a frequency spectrum of nonlinear distortion components produced when two signals are supplied to a power amplifier.

The frequency component is generated depending on the IM3 signals. Specifically, as shown in FIG. 17, when two signals having respective frequencies $f_1$ and $f_2$ are supplied to the power amplifier 1, the power amplifier 1 outputs not only IM3 signals having respective frequencies $(2f_1-f_2)$, $(2f_2-f_1)$ due to its nonlinearity, but also signals having respective frequencies $(f_2-f_1)$, $2(f_2-f_1)$, $3(f_2-f_1)$. The signal having the frequency $(f_2-f_1)$ is outputted as the product of the signals of the frequencies $f_1$, $f_2$, and has a level which is not related to the nonlinearity of the power amplifier 1. However, the signal having the frequency $2(f_2-f_1)$ has its level depending on the nonlinearity of the power amplifier 1 as it is outputted as the product of the signal having the frequency $f_1$ and the IM3 signal having the $(2f_2-f_1)$ or the product of the signal having the frequency $f_2$ and the IM3 signal of the $(2f_1-f_2)$. Therefore, the signal having the frequency $2(f_2-f_1)$ may be subject to a process of detecting nonlinear distortion. If the frequency $f_1$ is 8065 MHz and the frequency $f_2$ is 8070 MHz, then the frequency $2(f_2-f_1)$ is 10 MHz, so that the signal of the frequency $2(f_2-f_1)$ can be extracted using a filter having a relatively gradual cutoff characteristic curve. The signal having the frequency $3(f_2-f_1)$, which is 15 MHz, has a level lower than the level of the signal having the frequency of 10 MHz. Since the signal having the frequency $3(f_2-f_1)$ does not need to be cut off strictly, therefore, any filter which is used to extract the signal having the frequency $2(f_2-f_1)$ may be an inexpensive filter.

The extracting means 3 thus extracts a frequency component having a frequency which is twice the difference between the frequencies of the two reference signals. The frequency component extracted by the extracting means 3 is then detected by the detecting means 4, which outputs a DC voltage depending on the level of the detected frequency component.

The DC voltage is monitored by an inexpensive, light-weight voltmeter for adjusting the predistortion circuit 5. Consequently, the predistortion circuit 5 can be adjusted without use of a spectrum analyzer which is expensive and heavy.

Figure 2:
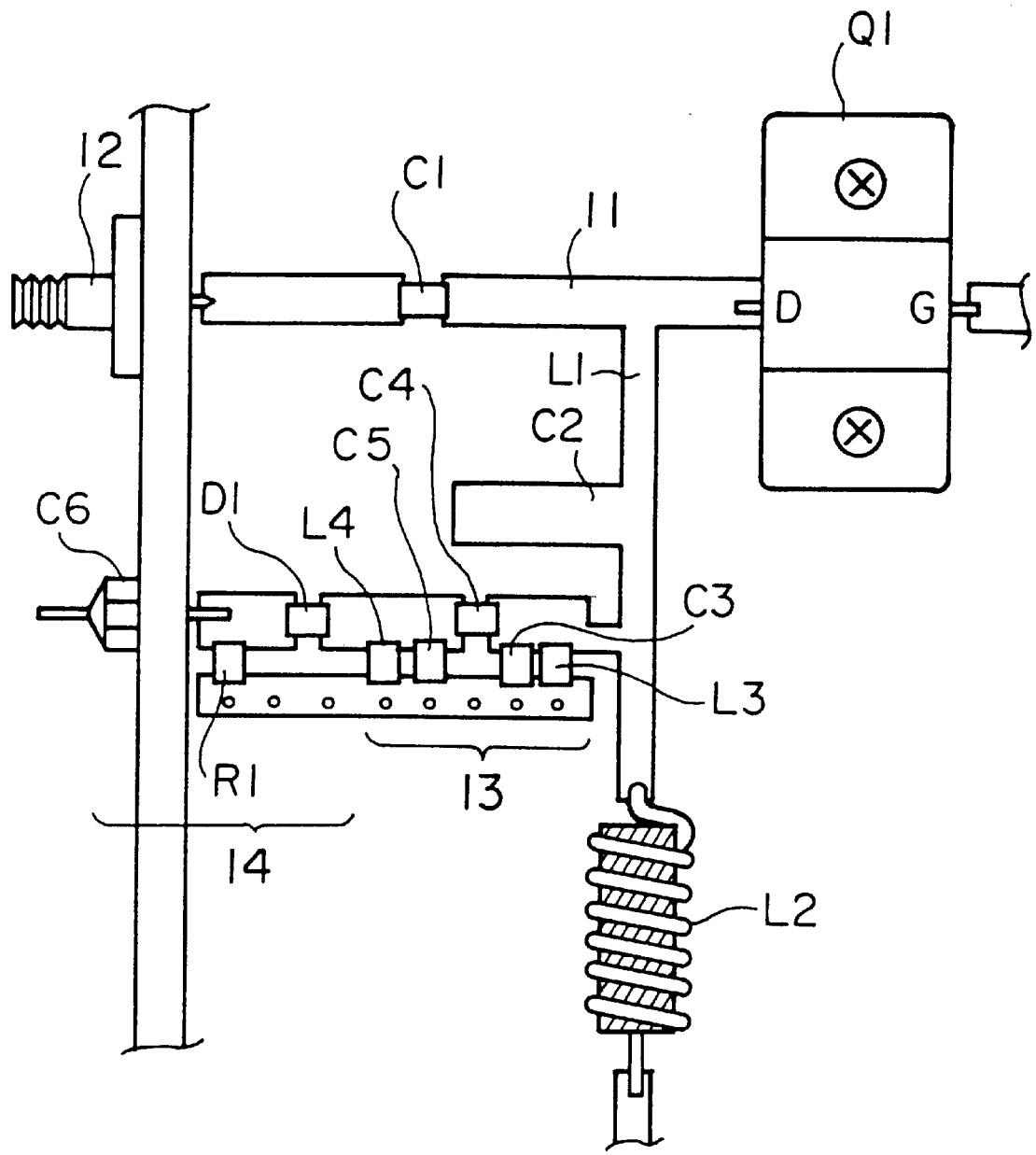
FIG. 2 is a view of structural details of the nonlinear distortion detecting circuit according to the first embodiment of the present invention.
Figure 3:
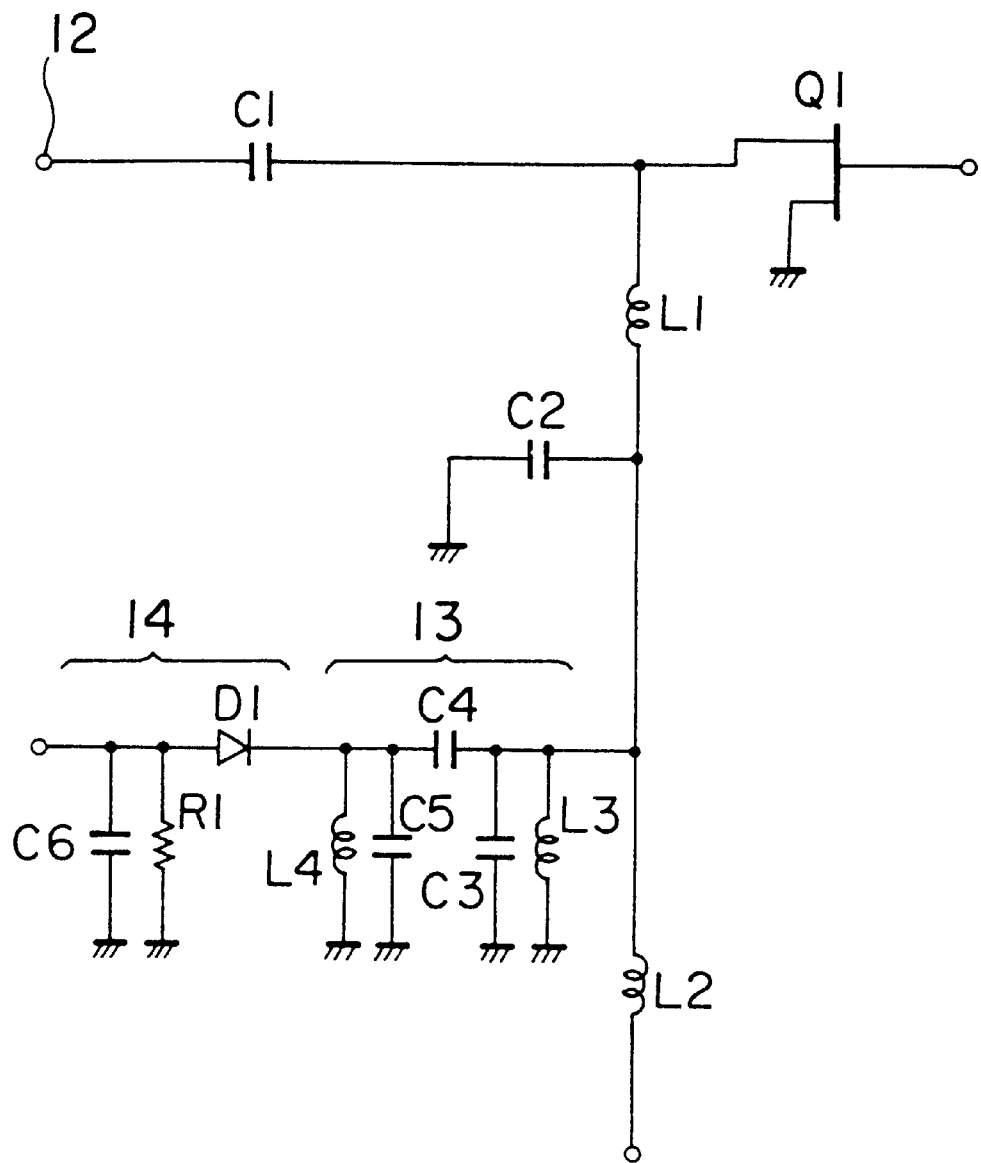
FIG. 3 is a circuit diagram of the nonlinear distortion detecting circuit according to the first embodiment of the present invention.

FIG. 2 shows structural details of the nonlinear distortion detecting circuit according to the first embodiment of the present invention. FIG. 3 shows a circuit arrangement of the nonlinear distortion detecting circuit according to the first embodiment of the present invention.

In FIGS. 2 and 3, the nonlinear distortion detecting circuit has an FET (field-effect transistor) Q1 comprising a GaAs FET which serves as a power amplifier (high-output amplifier) of a transmitter. The FET Q1 has a drain terminal D connected to a microstrip line 11 which is connected through a low-frequency-rejection capacitor C1 to an RF output terminal 12. A drain bias voltage is applied to the drain terminal D of the FET Q1 through a distributed-constant coil L1, a capacitor C2, and a choke coil L2. If two reference signals having respective frequencies of 65 MHz and 70 MHz are supplied to an input terminal of an intermediate-frequency amplifier which is connected to the FET Q1, and the intermediate-frequency amplifier up-converts the supplied signals into signals having respective frequencies of 8065 MHz and 8070 MHz, then the drain terminal D of the FET Q1 outputs signals having respective frequencies of 8065 MHz and 8070 MHz, and also outputs signals having respective frequencies of 8060 MHz, 8075 MHz, 5 MHz, 10 MHz, and 15 MHz. Of these signals, the signals having the frequencies of 5 MHz, 10 MHz, and 15 MHz are passed through a low-pass filter which is made up of the coil L1 and the capacitor C2. The choke coil L1 rejects all AC components.

A bandpass filter 13 is connected between the capacitor C2 and the choke coil L2. The bandpass filter 13 comprises coils L3, L4 and capacitors C3, C4, C5, and serves to pass the signal having the frequency of 10 MHz. To the bandpass filter 13, there is connected a detecting circuit 14 which comprises a diode D1, a resistor R1, and a through capacitor C6. The detecting circuit 14 detects the supplied signal having the frequency of 10 MHz and generates a DC voltage depending on the level of the detected signal.

Therefore, of all the signals outputted from the drain terminal D of the FET Q1, only the signal having the frequency of 10 MHz is delivered through the bandpass filter 13 to the detecting circuit 14, which generates a DC voltage depending on the level of an IM3 signal. The generated DC voltage is monitored by a voltmeter; and the predistortion circuit is manually adjusted until the monitored DC voltage becomes minimum. The predistortion circuit comprises an FET, and the level of the IM3 signal can be adjusted by varying a gate bias voltage for the FET.

The extracting means 3 shown in FIG. 1 corresponds to the bandpass filter 13 shown in FIGS. 2 and 3, and the detecting means 4 shown in FIG. 1 corresponds to the detecting circuit 14 shown in FIGS. 2 and 3, The input means 2 shown in FIG. 1 is not illustrated in FIGS. 2 and 3.

The choke coil L2 has an iron core for an increased inductance in order to pass a large drain bias direct current and reject all AC components.

Figure 4:
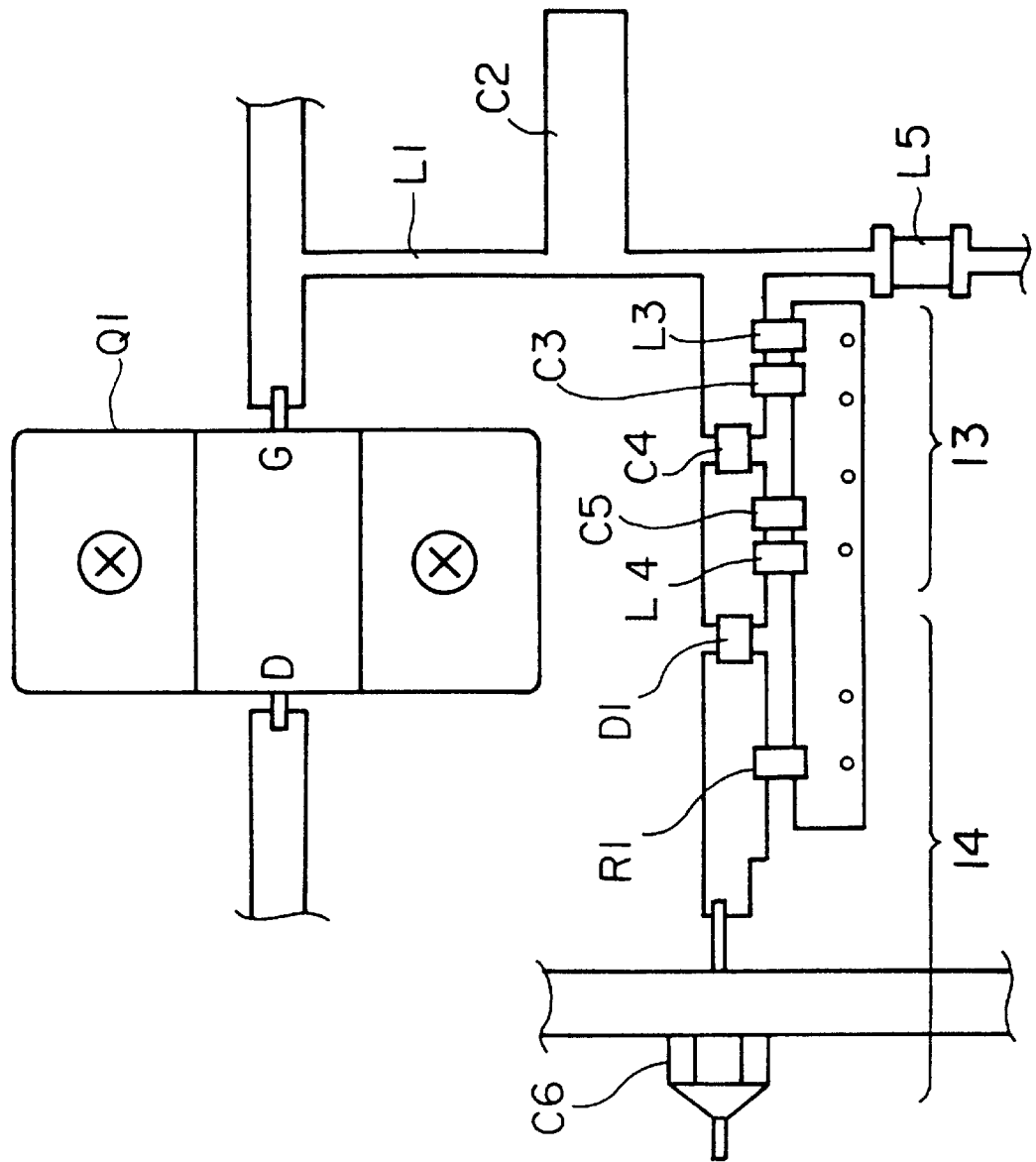
FIG. 4 is a view of structural details of a nonlinear distortion detecting circuit according to a second embodiment of the present invention.
Figure 5:
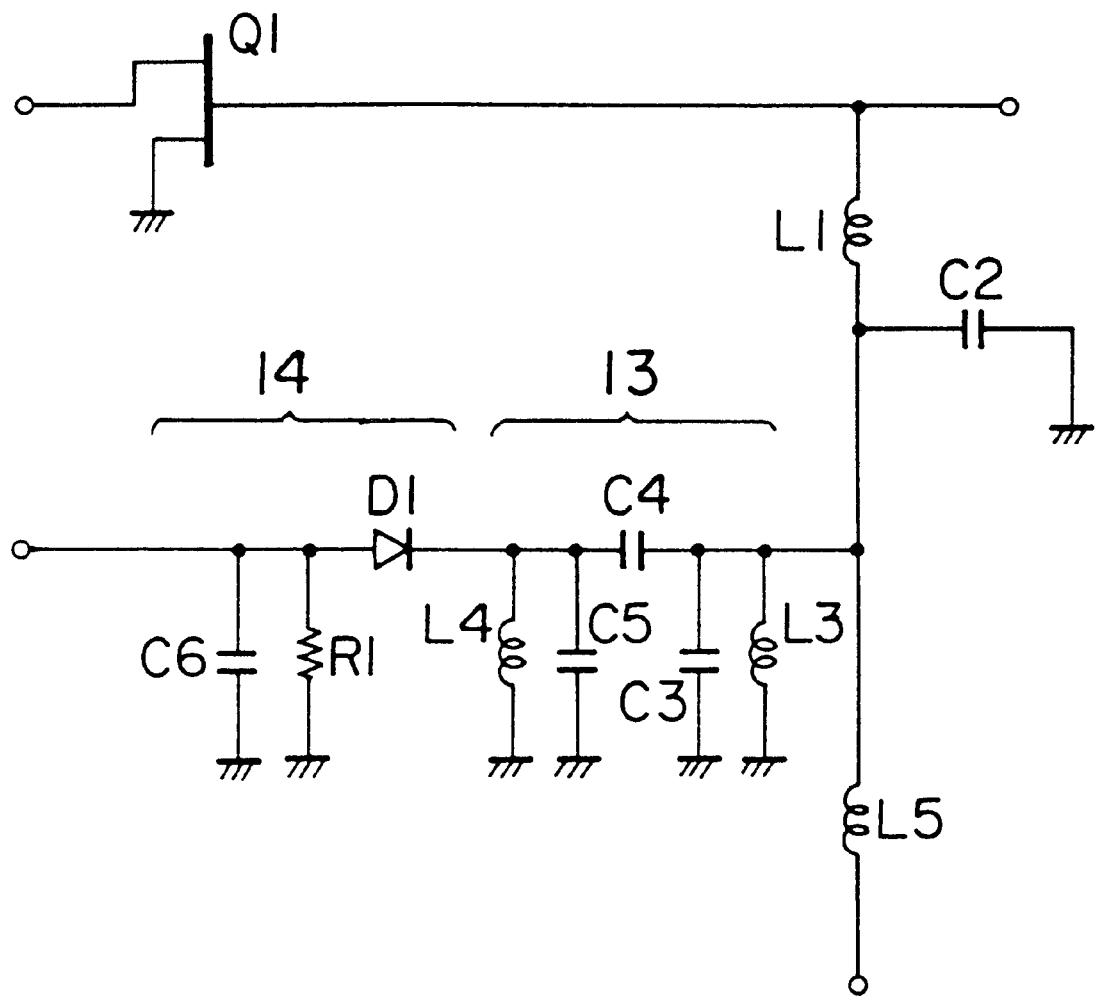
FIG. 5 is a circuit diagram of the nonlinear distortion detecting circuit according to the second embodiment of the present invention.

FIG. 4 shows structural details of a nonlinear distortion detecting circuit according to a second embodiment of the present invention. FIG. 5 shows a circuit arrangement of the nonlinear distortion detecting circuit according to the second embodiment of the present invention.

The nonlinear distortion detecting circuit according to the second embodiment is basically similar to the nonlinear distortion detecting circuit according to the first embodiment. Those parts of the nonlinear distortion detecting circuit according to the second embodiment which are identical to those of the nonlinear distortion detecting circuit according to the first embodiment are denoted by identical reference characters, and only different parts of the nonlinear distortion detecting circuit according to the second embodiment will be described below.

According to the second embodiment, a gate bias voltage is applied to a gate terminal G of the FET Q1 through the coil L1, the capacitor C2, and a chip coil L5. The chip coil L5 serves to reject AC components. The bandpass filter 13 is connected between the capacitor C2 and the chip coil L5, and the detecting circuit 14 is connected to the bandpass filter 13.

An IM3 signal is usually detected from the drain terminal D, which is an output terminal, of the FET Q1 as with the first embodiment described above. However, an IM3 signal is also present at a gate terminal, which is an input terminal, of the FET Q1. If such an IM3 signal may be detected from the gate terminal of the FET Q1 without suffering any practical problems, then the nonlinear distortion detecting circuit according to the second embodiment is effective in use. Specifically, the nonlinear distortion detecting circuit according to the first embodiment is necessarily large and expensive because of the choke coil L2 that is required. According to the second embodiment, since the gate terminal of the FET Q1, to which a small current from a bias source is supplied, is used to detect an IM3 signal, the AC-component-rejection coil L5 may comprise a chip coil which is inexpensive and can easily be mounted in place.

Figure 6:
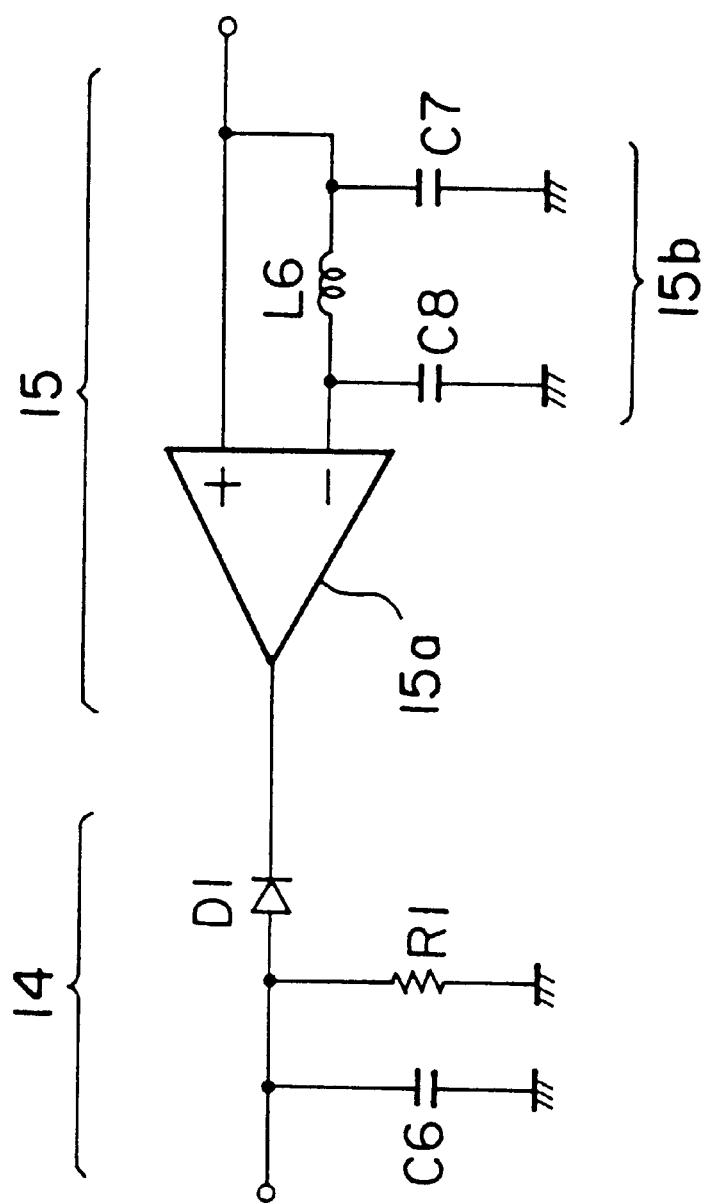
FIG. 6 is a circuit diagram of a nonlinear distortion detecting circuit according to a third embodiment of the present invention.

FIG. 6 shows a circuit arrangement of a nonlinear distortion detecting circuit according to a third embodiment of the present invention.

The nonlinear distortion detecting circuit according to the third embodiment is basically similar to the nonlinear distortion detecting circuit according to the first embodiment. Those parts of the nonlinear distortion detecting circuit according to the third embodiment which are identical to those of the nonlinear distortion detecting circuit according to the first embodiment are denoted by identical reference characters, and only different parts of the nonlinear distortion detecting circuit according to the third embodiment will be described below.

According to the third embodiment, a differential amplifier circuit 15 is used in place of the bandpass filter 13 according to the first embodiment. In FIG. 6, the FET Q1, the coil L1, the capacitor C2, the choke coil L2, etc. are omitted from illustration.

The differential amplifier circuit 15 comprises a differential amplifier 15a and a low-pass filter 15b. The low-pass filter 15b comprises capacitors C7, C8 and a coil L6. The low-pass filter 15b has a cutoff frequency set between 5 MHz and 10 MHz. Since signals having respective frequencies of 5 MHz, 10 MHz, and 15 MHz are supplied to the differential amplifier circuit 15, an inverting input terminal of the differential amplifier 15a is supplied with the signal having the frequency of 5 MHz from the low-pass filter 15b, and a non-inverting input terminal of the differential amplifier 15a is supplied with the signals having the frequencies of 5 MHz, 10 MHz, and 15 MHz. As a result, the differential amplifier 15a outputs the signals having the frequencies of 10 MHz and 15 MHz from its output terminal. Since the signal having the frequency of 15 MHz has a level smaller than the level of the signal having the frequency of 10 MHz, the differential amplifier circuit 15 practically outputs the signal having the frequency of 10 MHz to the detecting circuit 14.

Inasmuch as the differential amplifier circuit 15 according to the third embodiment is used in place of the bandpass filter 13 according to the first embodiment, the nonlinear distortion detecting circuit according to the third embodiment is not required to have an expensive bandpass filter. The differential amplifier circuit 15 according to the third embodiment may be used in place of the bandpass filter 13 according to the second embodiment.

Figure 7:
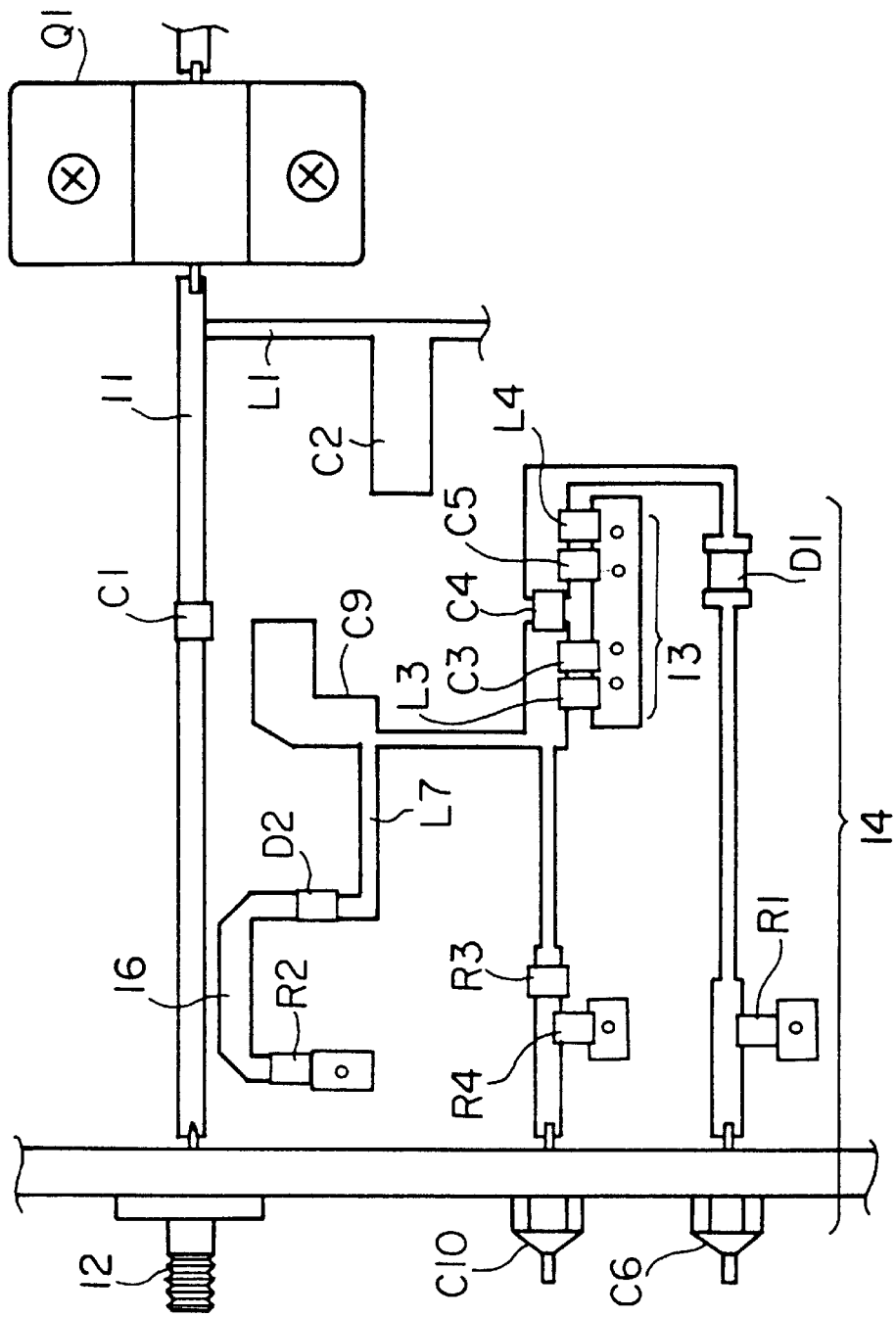
FIG. 7 is a view of structural details of a nonlinear distortion detecting circuit according to a fourth embodiment of the present invention.
Figure 8:
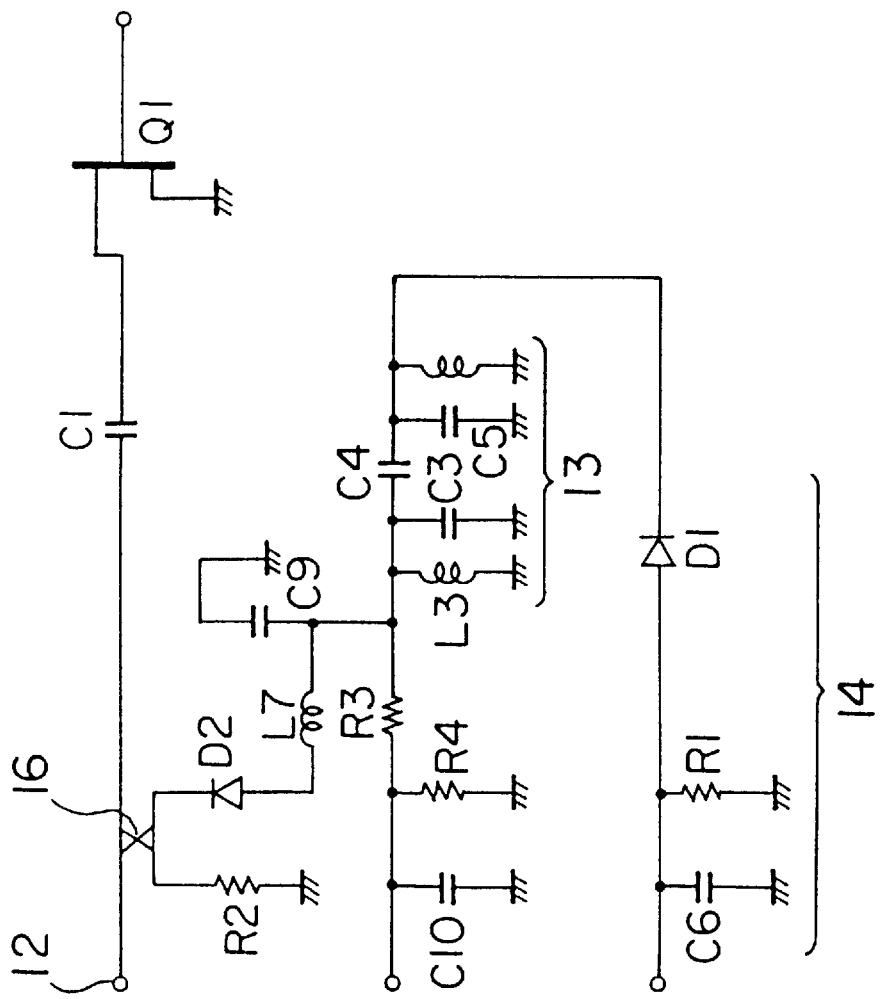
FIG. 8 is a circuit diagram of the nonlinear distortion detecting circuit according to the fourth embodiment of the present invention.

FIGS. 7 and 8 show a nonlinear distortion detecting circuit according to a fourth embodiment of the present invention.

The nonlinear distortion detecting circuit according to the fourth embodiment is basically similar to the nonlinear distortion detecting circuit according to the first embodiment. Those parts of the nonlinear distortion detecting circuit according to the fourth embodiment which are identical to those of the nonlinear distortion detecting circuit according to the first embodiment are denoted by identical reference characters, and only different parts of the nonlinear distortion detecting circuit according to the fourth embodiment will be described below.

According to the fourth embodiment, a coupler 16 is combined with the microstrip line 11 between the capacitor C1 and the RF output terminal 12, for extracting IM3 signals.

Generally, a transmitter often has a transmission output level control circuit for controlling a transmission output signal based on detection of the level of the transmission output signal. In FIG. 7, a transmission output level detecting circuit for detecting the level of a transmission output signal comprises the coupler 16, a resistor R2, a diode D2, a coil L7, a capacitor C9, a resistor R3, a resistor R4, and a through capacitor C10. The coupler 16 extracts signals having respective frequencies of 8065 MHz, 8070 MHz, 8060 MHz, and 8075 MHz. When these signals pass through the diode D2, it outputs these signals and also generates signals having respective frequencies of 5 MHz, 10 MHz, 15 MHz and DC components. Of these signals, a lowpass filter which is made up of the coil L7 and the capacitor C9 passes the signals having respective frequencies of 5 MHz, 10 MHz, 15 MHz and the DC components. These signals and DC components are averaged and outputted by a smoothing circuit which comprises the resistor R3, the resistor R4, and the through capacitor C10.

According to the fourth embodiment, the above circuit for detecting the level of a transmission output signal is incorporated in the nonlinear distortion detecting circuit. Specifically, the bandpass filter 13 is connected to an output terminal of the low-pass filter made up of the coil L7 and the capacitor C9, for extracting only the signal having the frequency of 10 MHz. The detecting circuit 14 is connected to an output terminal of the bandpass filter 13.

Therefore, a transmitter having such a circuit for detecting the level of a transmission output signal is capable of easily obtaining a DC voltage corresponding to an IM3 signal.

Figure 9:
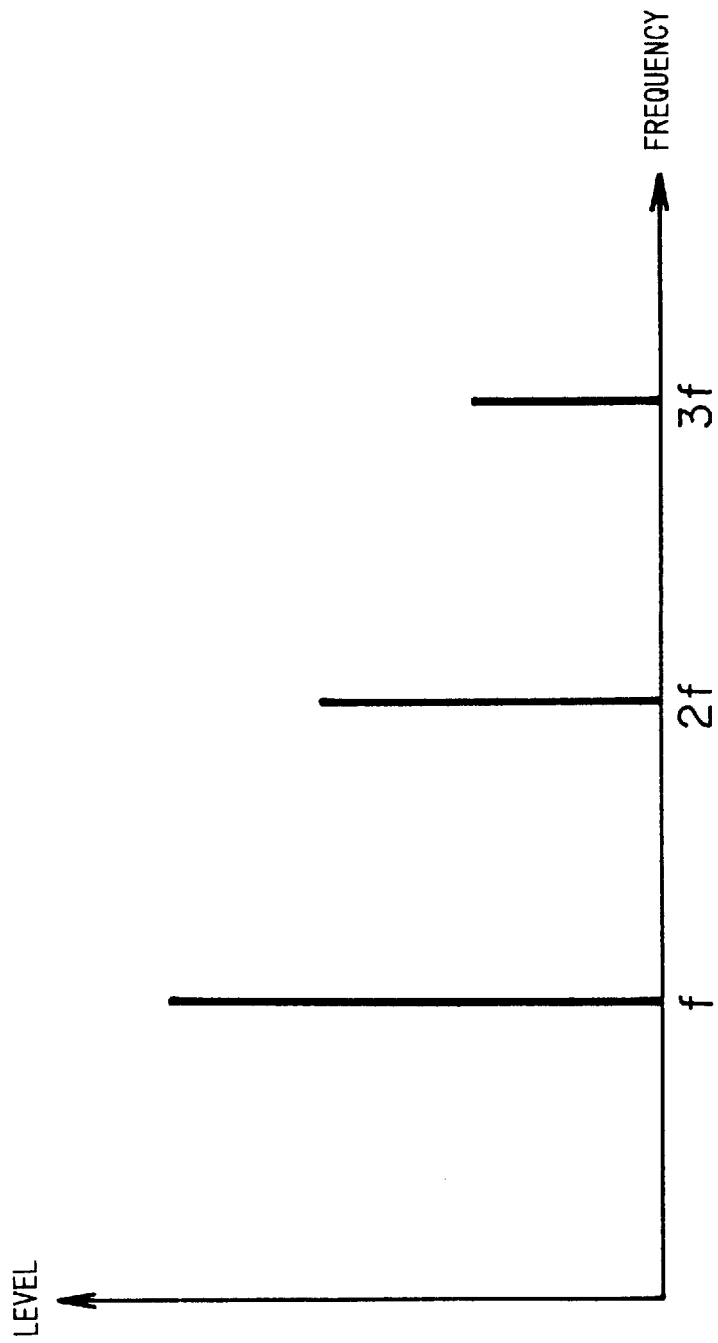
FIG. 9 is a diagram illustrative of the principles of a nonlinear distortion detecting circuit according to a fifth embodiment of the present invention.

The principles of a nonlinear distortion detecting circuit according to a fifth embodiment of the present invention will be described below with reference to FIG. 9.

Generally, when a single continuous wave CW having a frequency f is supplied to a power amplifier which is nonlinear, the power amplifier outputs harmonics having respective frequencies 2f, 3f,. . . Of these harmonics, the harmonic having the frequency 3f is correlated to an IM3 signal. Therefore, if the harmonic having the frequency 3f is extracted and detected to determine its level, then a predistortion circuit combined with the transmitter can be adjusted by monitoring the determined level. If the frequency f is 8070 MHz, for example, then the frequency 3f is 24210 MHz and the frequency 2f is 16140 MHz. Consequently, a filter for extracting the signal having the frequency 3f can be fabricated inexpensively.

Figure 10:
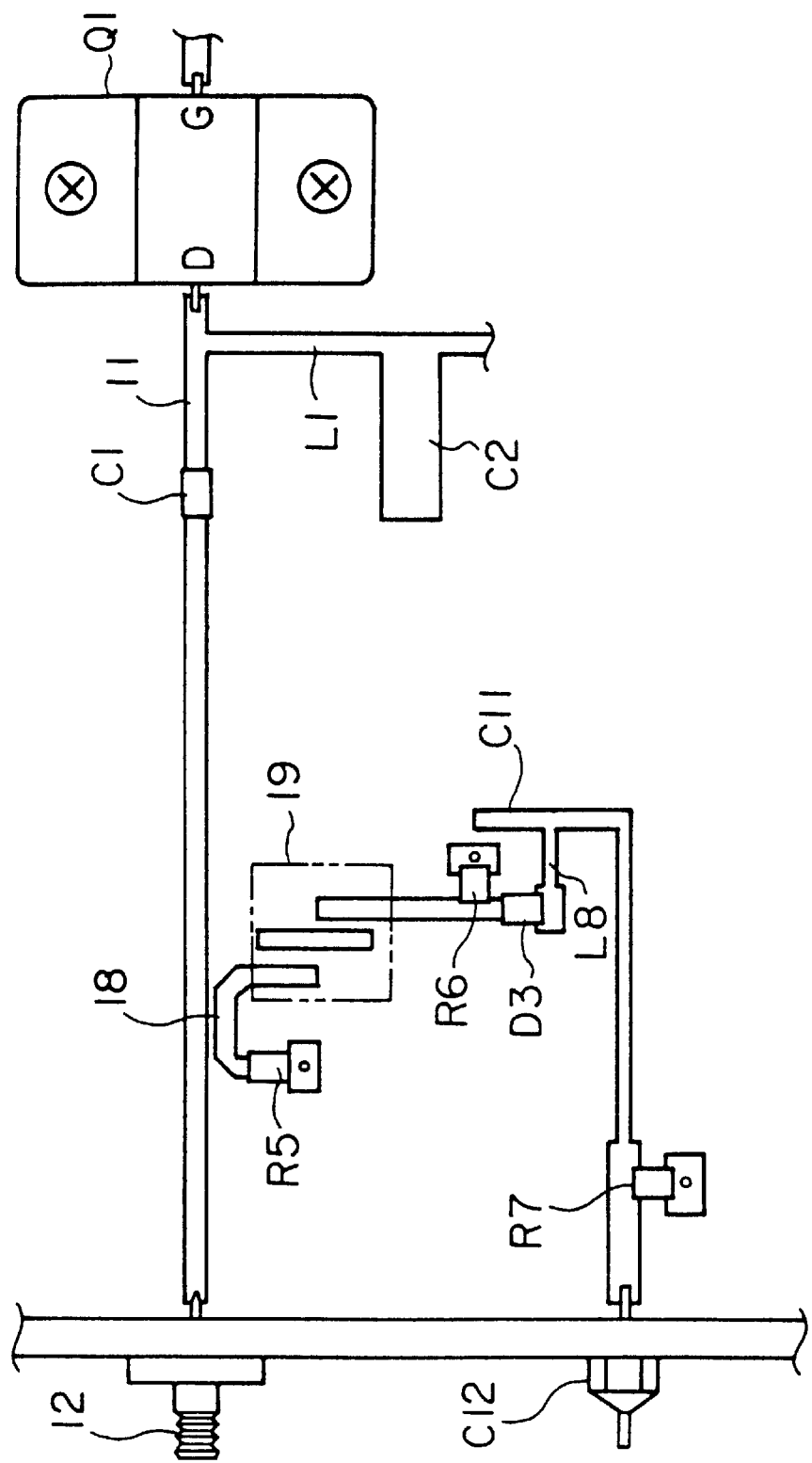
FIG. 10 is a view of structural details of the nonlinear distortion detecting circuit according to the fifth embodiment of the present invention.
Figure 11:
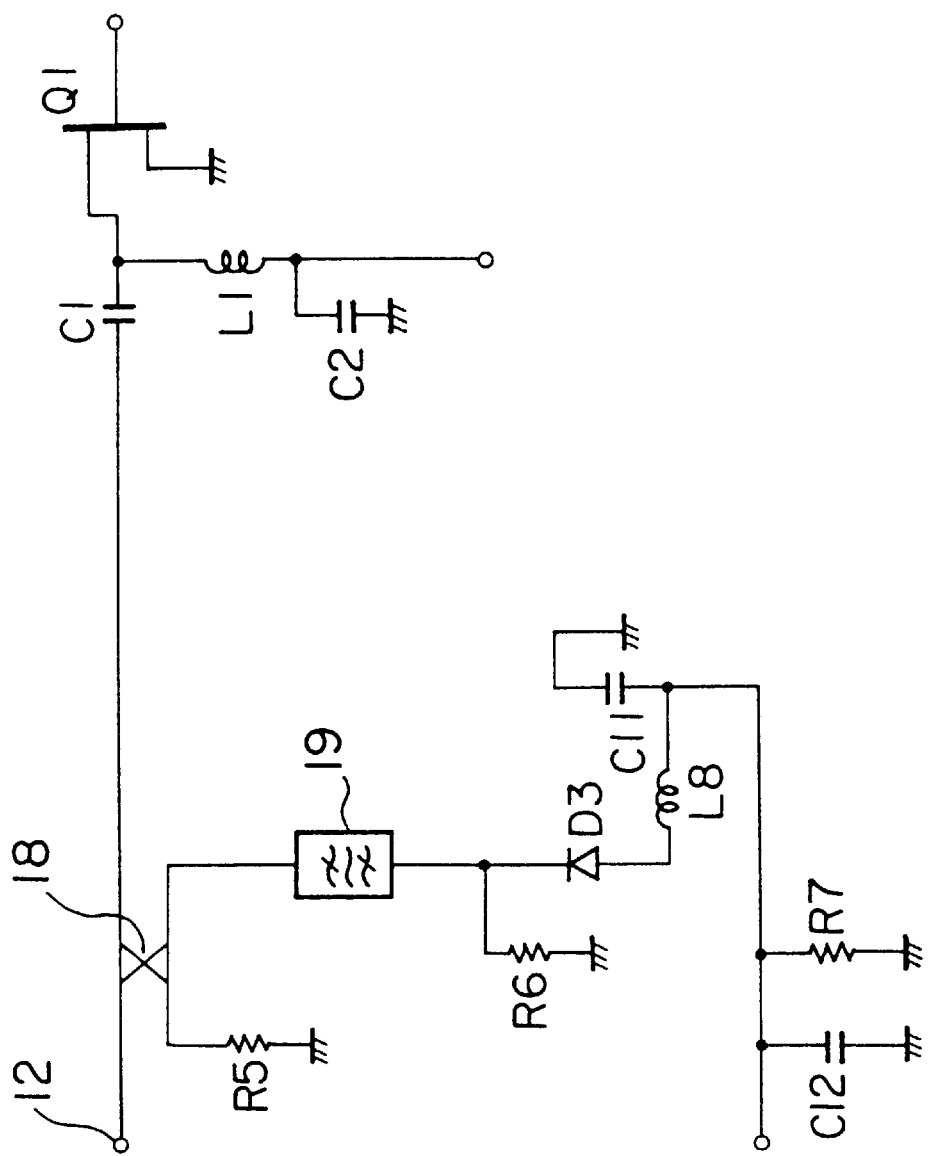
FIG. 11 is a circuit diagram of the nonlinear distortion detecting circuit according to the fifth embodiment of the present invention.

FIGS. 10 and 11 show the nonlinear distortion detecting circuit according to the fifth embodiment of the present invention.

The nonlinear distortion detecting circuit according to the fifth embodiment is basically similar to the nonlinear distortion detecting circuit according to the first embodiment.

Those parts of the nonlinear distortion detecting circuit according to the fifth embodiment which are identical to those of the nonlinear distortion detecting circuit according to the first embodiment are denoted by identical reference characters, and only different parts of the nonlinear distortion detecting circuit according to the fifth embodiment will be described below.

According to the fifth embodiment, a reference signal having a frequency of 70 MHz, for example, is supplied to an intermediate-frequency amplifier which is connected to the FET Q1, and up-converted into a signal having a frequency of 8070 MHz (=f). When the signal having the frequency of 8070 MHz is supplied to the FET Q1, the drain terminal D of the FET Q1 outputs the signal having the frequency of 8070 MHz, and also outputs signals having respective frequencies of 16140 MHz (=2f) and 24210 MHz (=3f) due to its nonlinearity.

A coupler 18 is combined with the microstrip line 11 connected between the capacitor C1 and the RF output terminal 12, for extracting the signals having the respective frequencies of 8070 MHz, 16140 MHz, and 24210 MHz. A bandpass filter 19 is connected to the coupler 18 to extract only the signal having the frequency of 24210 MHz. The bandpass filter 19 comprises three parallel microstrip lines, with the central microstrip line having a length equal to ½ of the wavelength of the signal having the frequency of 24210 MHz. The portions of the other opposite microstrip lines which flank the central microstrip line have a length equal to ¼ of the wavelength of the signal having the frequency of 24210 MHz. The bandpass filter 19 thus constructed resonates with the frequency of 24210 MHz.

The bandpass filter 19 extracts only the signal having the frequency of 24210 MHz, and sends the extracted signal to a detecting circuit which comprises a diode D3, resistors R6, R7, a through capacitor C12, and a low-pass filter comprising a coil L8 and a capacitor C11. The detecting circuit produces a DC voltage depending on the level of the signal having the frequency of 24210 MHz. Since the DC voltage produced by the detecting circuit is correlated to the magnitude of an IM3 signal, the DC voltage is monitored to adjust a predistortion circuit.

Figure 12:
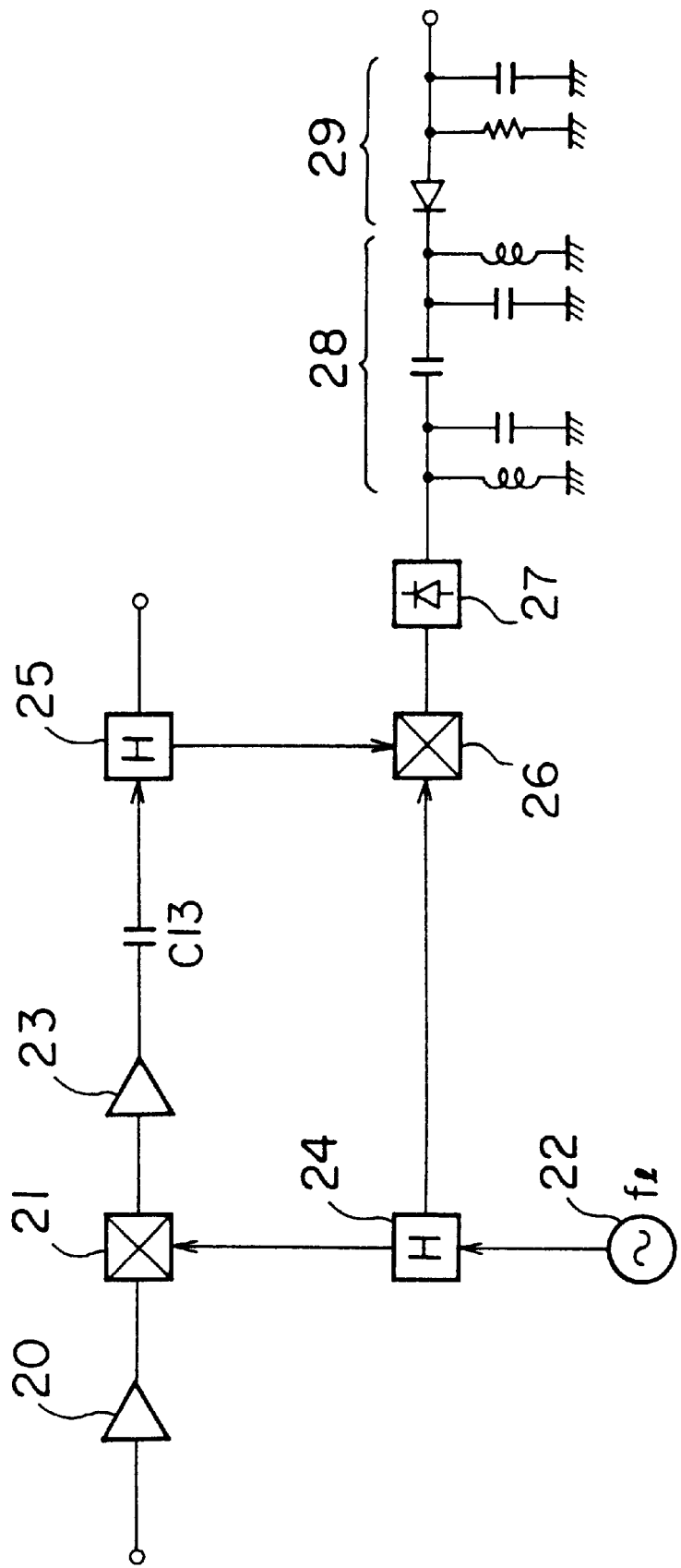
FIG. 12 is a circuit diagram of a nonlinear distortion detecting circuit according to a sixth embodiment of the present invention.

FIG. 12 shows a nonlinear distortion detecting circuit according to a sixth embodiment of the present invention.

As shown in FIG. 12, a transmitter has an intermediate-frequency amplifier 20, a mixer (up-converter) 21, a local oscillator 22, and a power amplifier (high-output amplifier) 23. A branching unit 24 is connected between the mixer 21 and the local oscillator 22 for delivering a local oscillation signal from the local oscillator 22 to a mixer (down-converter) 26. Another branching unit 25 is connected to an output terminal of the power amplifier 23 for delivering a portion of a transmission output signal from the power amplifier 23 to the mixer 26. When two reference signals having respective frequencies of 65 MHz and 70 MHz are supplied to the intermediate-frequency amplifier 20 and a local oscillation signal having a frequency of 8000 MHz is supplied from the local oscillator 22 to the mixer 21, the mixer 21 up-converts output signals from the intermediate-frequency amplifier 20 into signals having respective frequencies of 8065 MHz and 8070 MHz. At this time, the power amplifier 23 outputs the signals having the frequencies of 8065 MHz and 8070 MHz, and also outputs IM3 signals having respective frequencies of 8060 MHz and 8075 MHz due to its nonlinearity. Therefore, when supplied with the local oscillation signal having the frequency of 8000 MHz from the local oscillator 22, the mixer 26 down-converts the signals from the power amplifier 23 into signals having respective frequencies of 60 MHz, 65 MHz, 70 MHz, and 75 MHz. The signals having the frequencies of 60 MHz and 75 MHz correspond to the IM3 signals having the frequencies of 8060 MHz and 8075 MHz.

The output signals from the mixer 26 are sent to a nonlinear circuit 27 comprising diodes, etc. As a result, the nonlinear circuit 27 generates signals having respective frequencies of 5 MHz, 10 MHz, and 15 MHz. As the signal having the frequency of 10 MHz is generated depending on the signals having the frequencies of 60 MHz and 75 MHz, the signal having the frequency of 10 MHz corresponds to an IM3 signal. A bandpass filter 28 then extracts only the signal having the frequency of 10 MHz, which is then detected and converted into a DC voltage by a detecting circuit 29. The bandpass filter 28 and the detecting circuit 29 have internal structures which are identical to those of the bandpass filter 13 and the detecting circuit 14 according to the first embodiment.

The nonlinear distortion detecting circuit according to the sixth embodiment does not need the choke coil L2 according to the first embodiment. Unlike the nonlinear distortion detecting circuit according to the fourth embodiment, the nonlinear distortion detecting circuit according to the sixth embodiment can be incorporated in a transmitter of the type which has no transmission output level control circuit.

A nonlinear distortion compensating circuit according to a seventh embodiment of the present invention will be described below with reference to FIG. 13. The nonlinear distortion compensating circuit according to the seventh embodiment automatically compensates for a nonlinear distortion using an IM3-dependent voltage which has been produced by any one of the nonlinear distortion detecting circuits according to the first through sixth embodiments described above.

Figure 13:
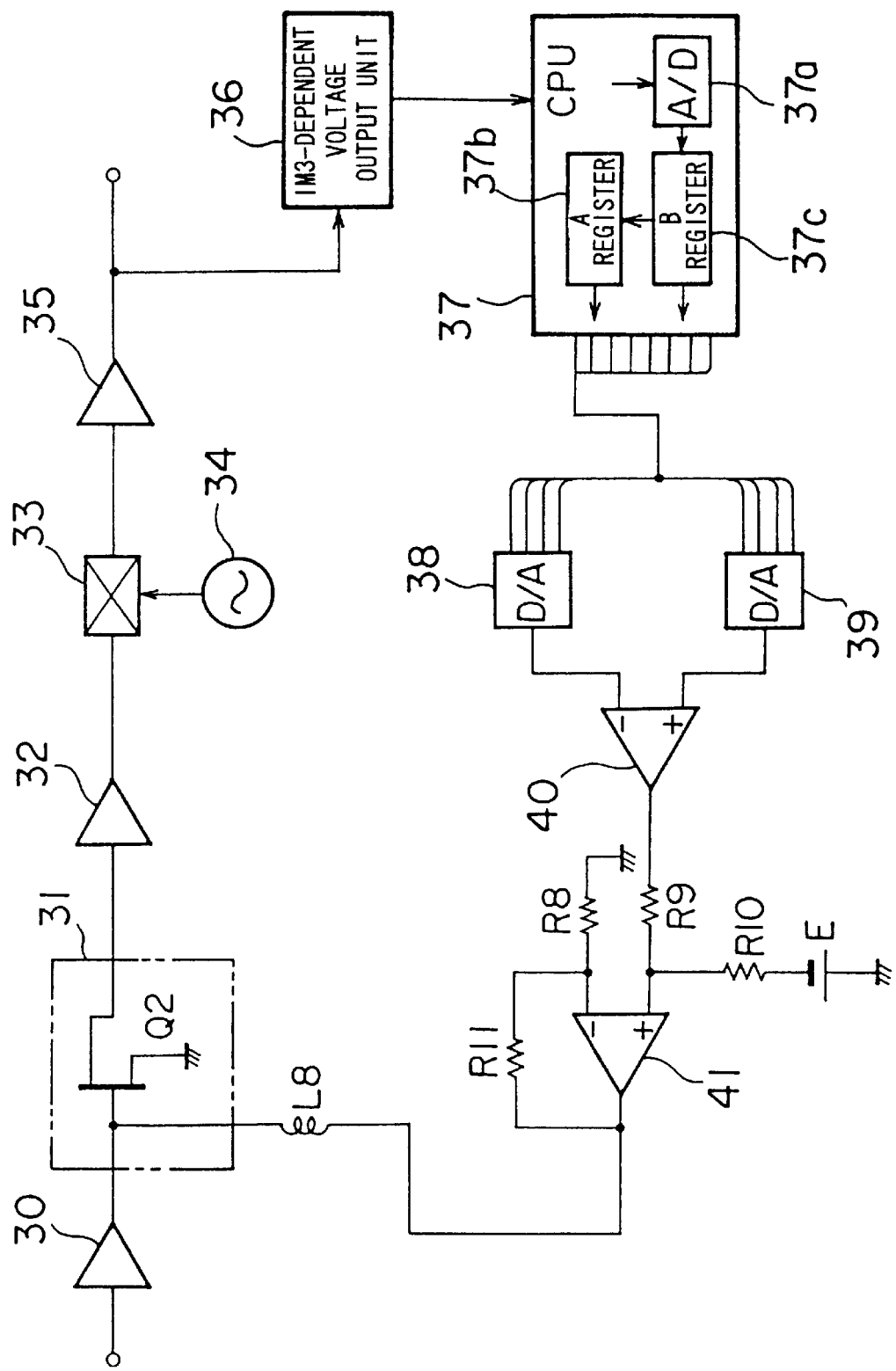
FIG. 13 is a block diagram of a nonlinear distortion compensating circuit according to a seventh embodiment of the present invention.
Figure 14:
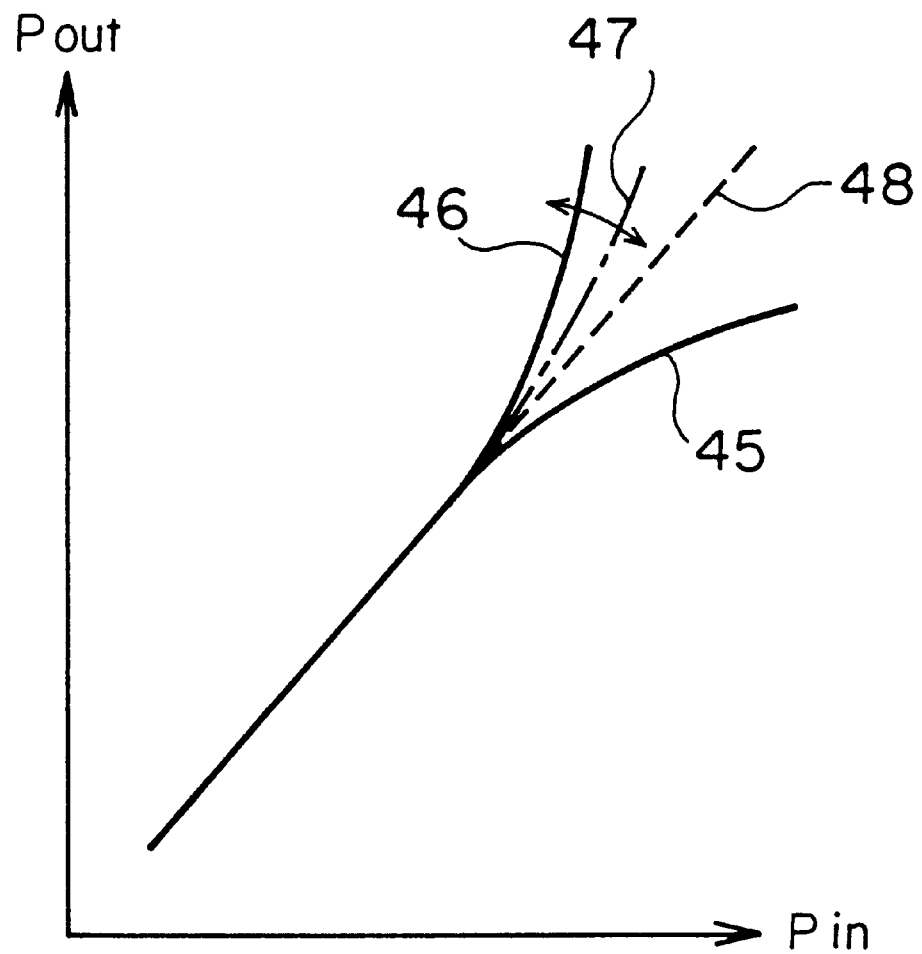
FIG. 14 is a diagram showing input vs. output power characteristics of a power amplifier and a predistortion circuit of the nonlinear distortion compensating circuit according to the seventh embodiment of the present invention.
Figure 15:
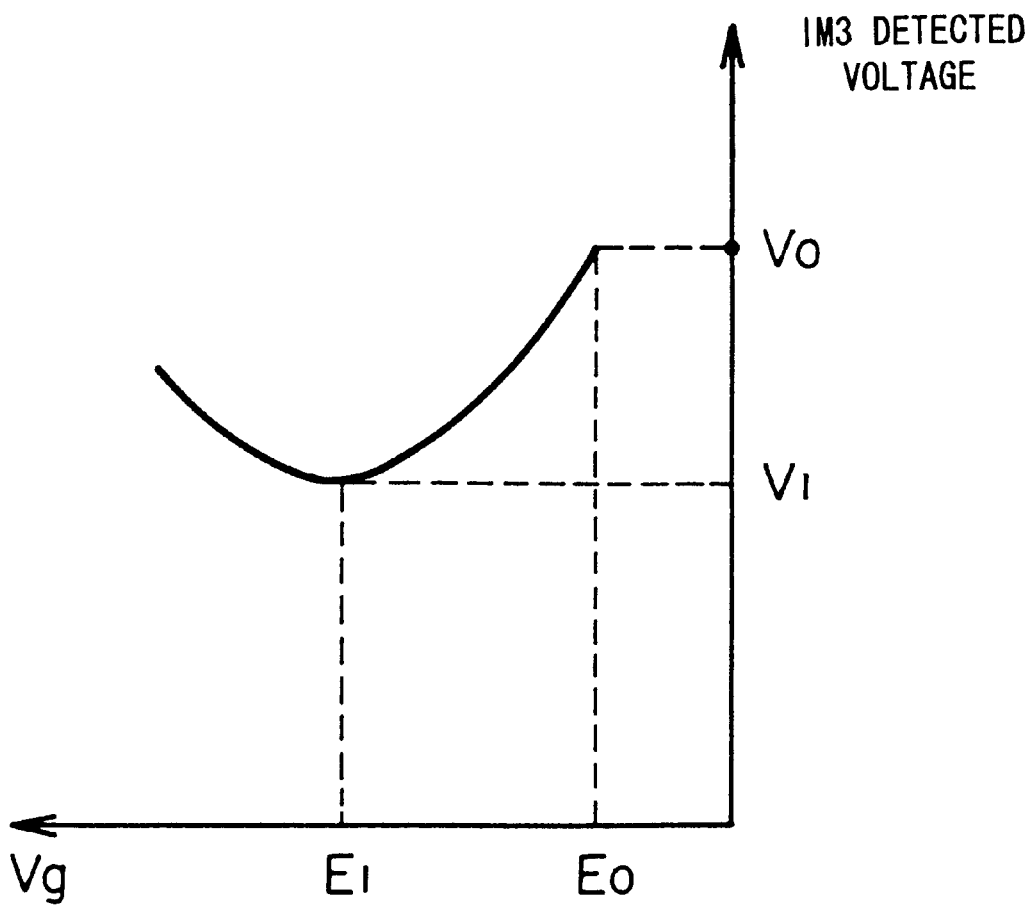
FIG. 15 is a diagram illustrative of how the nonlinear distortion compensating circuit according to the seventh embodiment of the present invention operates.

As shown in FIG. 13, a transmitter comprises an intermediate-frequency amplifier 30, a predistortion circuit 31, an intermediate-frequency amplifier 32, a frequency converter 33, a local oscillator 34, and a power amplifier 35. The power amplifier 35 has an input vs. output power characteristic curve 45 as shown in FIG. 14. The predistortion circuit 31 comprises an FET Q2 having a gate voltage Vg (of a negative value) set to a value near a pinch-off voltage. The predistortion circuit 31 thus constructed has an input vs. output power characteristic curve 46 as shown in FIG. 14. If the gate voltage Vg of the predistortion circuit 31 is increased, i.e., if the absolute value of the gate voltage Vg of a negative value is reduced, then the predistortion circuit 31 has an input vs. output power characteristic curve 47 as shown in FIG. 14. Heretofore, it has been customary to manually adjust the gate voltage Vg to compensate for the input vs. output power characteristic of the power amplifier 35 with the input vs. output power characteristic of the predistortion circuit 31 until a linear input vs. output power characteristic curve 48 is finally obtained for the power amplifier 35. As can be seen from the curves 46, 47 in FIG. 14, the gate voltage Vg of the FET Q2 of the predistortion circuit 31 and the IM3-dependent voltage are related to each other as shown in FIG. 15. Specifically, when the gate voltage Vg which provides the linear input vs. output power characteristic curve 48 shown in FIG. 14 has a value $E_1$, the IM3-dependent voltage is of a minimum value $V_1$, and will be greater than the value $V_1$ even if the gate voltage Vg is adjusted to a value greater or smaller than the value $E_1$.

According to the seventh embodiment, an IM3-dependent voltage output unit 36 is connected to the output terminal of the power amplifier 35. The IM3-dependent voltage output unit 36 corresponds to the nonlinear distortion detecting circuit according to any of the first through sixth embodiments. The IM3-dependent voltage output unit 36 outputs a DC voltage corresponding to an IM3 signal to a CPU (central processing unit) 37. The CPU 37 comprises an A/D (analog-to-digital) converter 37a, an A register 37b, and a B register 37c. The CPU 37 sends an output signal to D/A (digital-to-analog) converters 38, 39, which apply respective digital output signals to an operational amplifier 40. The operational amplifier 40 supplies an output signal through an operational amplifier 41 and other components to the predistortion circuit 31.

Figure 16:
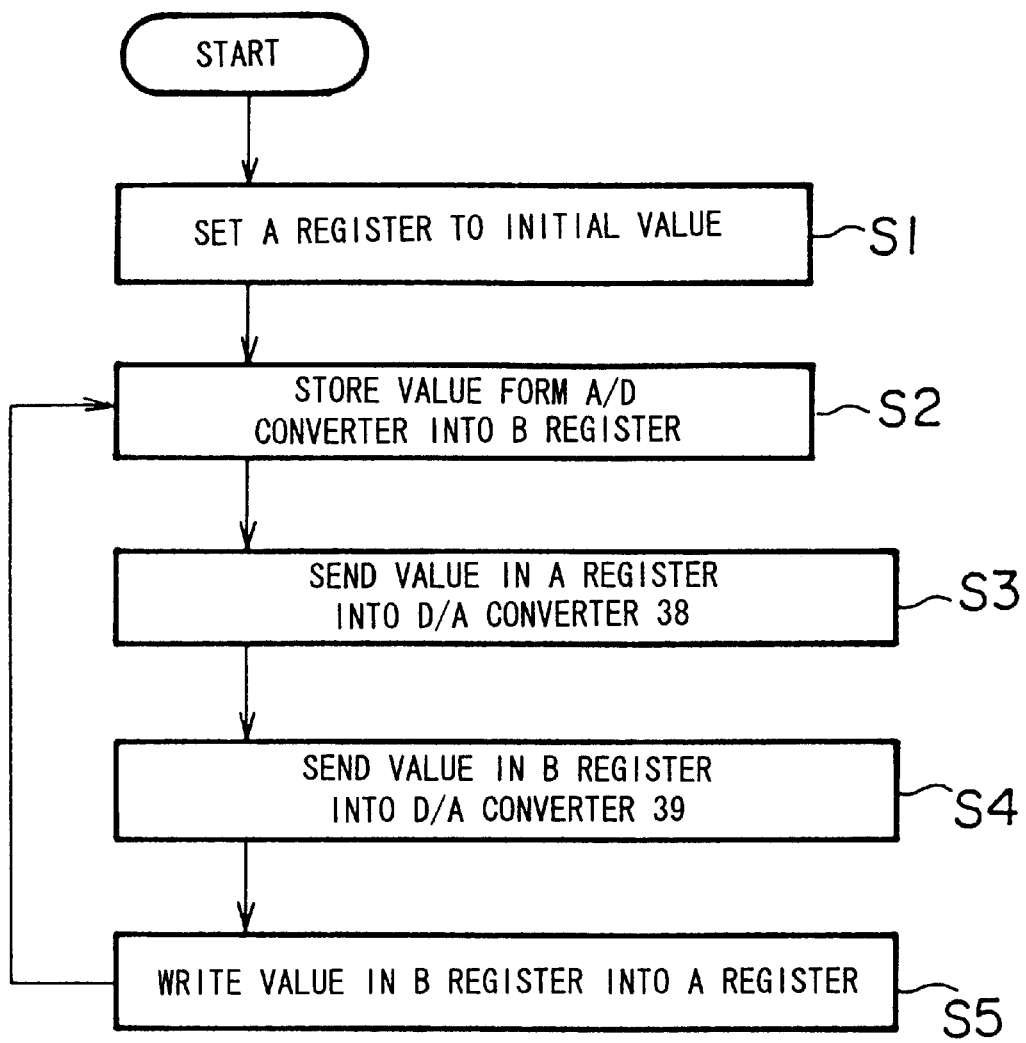
FIG. 16 is a flowchart of a processing sequence of a CPU of the nonlinear distortion compensating circuit according to the seventh embodiment of the present invention.

FIG. 16 shows a processing sequence of the CPU 37. Successive steps S1~S5 of the processing sequence of the CPU 37 will be described below.

[S1] First, the CPU 37 sets the A register 37b to an initial value. Specifically, the CPU 37 reduces the output signal from the operational amplifier 40 to zero, and establishes at this time a power supply voltage E for the positive terminal of the operational amplifier 41 such that the gate voltage Vg of the FET Q2 of the predistortion circuit 31 is of a relatively large value $E_0$ in FIG. 15. Then, the CPU 37 determines a voltage $V_0$ outputted from the IM3-dependent voltage output unit 36, and sets the A register 37b to the voltage $V_0$ as an initial value.

[S2] Then, when the gate voltage Vg of the FET Q2 slightly changes in a certain direction, the CPU 37 stores a voltage outputted from the IM3-dependent voltage output unit 36 through the A/D converter 37a into the B register 37c. Immediately after the step S1, the gate voltage Vg changes in the leftward direction from the value $E_0$ in FIG. 15, and hence is reduced.

[S3] The CPU 37 sends the value stored in the A register 37b to the D/A converter 38.

[S4] The CPU 37 sends the value stored in the B register 37c to the D/A converter 39.

[S5] The CPU 37 writes the value stored in the B register 37c into the A register 37b. Then, control returns to the step S2.

According to the above processing sequence, the present value of the IM3-dependent voltage is outputted from the D/A converter 39, and the preceding value of the IM3-dependent voltage is outputted from the D/A converter 38.

If the present value of the IM3-dependent voltage is smaller than the preceding value of the IM3-dependent voltage, then the operational amplifier 40 outputs a negative voltage. If the present value of the IM3-dependent voltage is greater than the preceding value of the IM3-dependent voltage, then the operational amplifier 40 outputs a positive voltage. When supplied with a negative voltage, the operational amplifier 41 reduces the gate voltage Vg of the FET Q2. When supplied with a positive voltage, the operational amplifier 41 increases the gate voltage Vg of the FET Q2. Specifically, if the present value of the IM3-dependent voltage becomes smaller than the preceding value of the IM3-dependent voltage as a result of reducing the gate voltage Vg, then since the nonlinear distortion is reduced, the gate voltage Vg of the FET Q2 is varied in the same direction, i.e., reduced. Conversely, if the present value of the IM3-dependent voltage becomes greater than the preceding value of the IM3-dependent voltage as a result of reducing the gate voltage Vg, then since the nonlinear distortion is increased, the gate voltage Vg of the FET Q2 is varied in the opposite direction, i.e., increased. The above process is repeated until an optimum point where the nonlinear distortion is minimum is reached, i.e., the IM3-dependent voltage and the gate voltage converge to $V_1$ and $E_1$, respectively.

Consequently, the nonlinear distortion compensating circuit according to the seventh embodiment is capable of automatically compensating for a nonlinear distortion using an IM3-dependent voltage which has been produced by any one of the nonlinear distortion detecting circuits according to the first through sixth embodiments described above.

With the present invention, as described above, a nonlinear distortion detecting circuit has an extracting means for extracting a frequency component having a frequency which is twice the difference between the frequencies of two reference signals from signals supplied from the power amplifier, and a detecting means for detecting the frequency component extracted by the extracting means. Therefore, the nonlinear distortion detecting circuit can detect a third-order intermodulation distortion (IM3) component as a DC voltage, and a predistortion circuit can be adjusted simply by monitoring a voltmeter for the DC voltage. Consequently, it is not necessary to carry an expensive and heavy spectrum analyzer for adjusting a transmitter for panel replacement or maintenance. Furthermore, no spectrum analyzer is needed when testing a transmitter in a factory.

Since a nonlinear distortion is represented by a DC voltage that can easily be handled, the nonlinear distortion can be compensated for automatically using the DC voltage.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A nonlinear distortion detecting circuit in a transmitter which generates a third-order intermodulation distortion due to nonlinearity thereof, comprising:

a power amplifier;

input means for entering two reference signals having respective different frequencies at a stage preceding said power amplifier;

extracting means for extracting a frequency component having a frequency which is twice the difference between the frequencies of said two reference signals, based on a signal supplied from a predetermined section of said power amplifier; and detecting means for detecting the frequency component extracted by said extracting means.

2. A nonlinear distortion detecting circuit according to claim 1, wherein said transmitter has an intermediate-frequency amplifier, said input means being disposed in said intermediate-frequency amplifier.

3. A nonlinear distortion detecting circuit according to claim 1, wherein said power amplifier has a final-stage transistor, said predetermined section comprising an output terminal of said final-stage transistor.

4. A nonlinear distortion detecting circuit according to claim 1, wherein said power amplifier has a final-stage transistor, said predetermined section comprising an input terminal of said final-stage transistor.

5. A nonlinear distortion detecting circuit according to claim 1, wherein said extracting means comprises a band-pass filter for passing said frequency which is twice the difference between the frequencies of said two reference signals.

6. A nonlinear distortion detecting circuit according to claim 1, wherein said extracting means comprises:

a filter for extracting frequency components which are integral multiples of said difference between the frequencies of said two reference signals; and a differential amplifier for extracting said frequency component having the frequency which is twice the difference between the frequencies of said two reference signals, from the frequency components extracted by said filter.

7. A nonlinear distortion detecting circuit according to claim 1, wherein said extracting means comprises:

transmission output level detecting means for detecting a signal supplied from an output terminal of said power amplifier to detect the level of a transmission output signal from said power amplifier; and a filter for extracting the frequency component having the frequency which is twice the difference between the frequencies of said two reference signals, based on a signal detected by said transmission output level detecting means.

8. A nonlinear distortion detecting circuit according to claim 1, wherein said transmitter has a local oscillator, and said extracting means comprises:

frequency converting means for down-converting a signal supplied from an output terminal of said power amplifier using a local oscillation signal outputted from said local oscillator;

a nonlinear circuit for being supplied with an output signal from said frequency converting means; and a filter for extracting the frequency component having the frequency which is twice the difference between the frequencies of said two reference signals, based on a signal outputted from said nonlinear circuit.

* * * * *